United States Patent
Yamada et al.

(10) Patent No.: US 10,802,048 B2
(45) Date of Patent: Oct. 13, 2020

(54) UNIVERSAL TEST SOCKET, SEMICONDUCTOR TEST DEVICE, AND METHOD OF TESTING SEMICONDUCTOR DEVICES

(71) Applicant: Samsung Electronics Co., Ltd., Suwon-si, Gyeonggi-do (KR)

(72) Inventors: Daisuke Yamada, Asan-si (KR); Dong-uhn Shin, Asan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 72 days.

(21) Appl. No.: 16/030,346

(22) Filed: Jul. 9, 2018

(65) Prior Publication Data

US 2019/0011482 A1    Jan. 10, 2019

(30) Foreign Application Priority Data

Jul. 10, 2017   (KR) .................. 10-2017-0087283

(51) Int. Cl.
| | |
|---|---|
| *G01R 1/073* | (2006.01) |
| *H05K 1/11* | (2006.01) |
| *G01R 31/26* | (2020.01) |
| *G01R 1/04* | (2006.01) |
| *G01R 35/00* | (2006.01) |
| *G01R 31/28* | (2006.01) |

(52) U.S. Cl.
CPC ......... *G01R 1/0735* (2013.01); *G01R 1/0466* (2013.01); *G01R 1/07364* (2013.01); *G01R 31/2601* (2013.01); *H05K 1/11* (2013.01); *G01R 1/0483* (2013.01); *G01R 31/2863* (2013.01); *G01R 31/2865* (2013.01); *G01R 35/00* (2013.01); *H05K 2201/10325* (2013.01)

(58) Field of Classification Search
None
See application file for complete search history.

(56) References Cited

U.S. PATENT DOCUMENTS

| | | | | |
|---|---|---|---|---|
| 5,491,427 A | * | 2/1996 | Ueno ................. | G01R 1/07364 324/750.16 |
| 6,204,681 B1 | * | 3/2001 | Nagatsuka ......... | G01R 31/2886 324/756.02 |
| 6,690,564 B1 | * | 2/2004 | Haruta ................. | H01R 43/007 361/212 |

(Continued)

FOREIGN PATENT DOCUMENTS

| | | |
|---|---|---|
| JP | 2003-092317 A | 3/2003 |
| JP | 3788361 B2 | 6/2006 |

(Continued)

*Primary Examiner* — Jas A Sanghera
(74) *Attorney, Agent, or Firm* — Harness, Dickey & Pierce, P.L.C.

(57) ABSTRACT

A universal test socket including a first sub-layer including a plurality of first through conductors, the plurality of first through conductors arranged at a first pitch in a first substrate, and a second sub-layer including a plurality of second through conductors, the second sub-layer stacked on the first sub-layer so that the plurality of first through conductors are in contact with the plurality of second through conductors, the plurality of second through conductors arranged at a second pitch in a second substrate, the second pitch being less than or equal to the first pitch may be provided.

19 Claims, 23 Drawing Sheets

(56) References Cited

U.S. PATENT DOCUMENTS

| | | | |
|---|---|---|---|
| 6,969,622 B1 | 11/2005 | Kokubo et al. | |
| 7,038,471 B2 * | 5/2006 | Kimura | G01R 31/2812 |
| | | | 324/538 |
| 7,309,244 B2 | 12/2007 | Yamada et al. | |
| 7,318,729 B2 | 1/2008 | Sato et al. | |
| 7,323,712 B2 * | 1/2008 | Kokubo | H01R 13/2414 |
| | | | 257/48 |
| 8,810,269 B2 | 8/2014 | Gong et al. | |
| 2007/0281516 A1 * | 12/2007 | Yamada | G01R 1/0735 |
| | | | 439/91 |
| 2009/0072844 A1 * | 3/2009 | Kimura | G01R 1/0735 |
| | | | 324/762.05 |
| 2010/0051178 A1 * | 3/2010 | Lee | B32B 37/025 |
| | | | 156/152 |
| 2014/0091819 A1 | 4/2014 | Gong et al. | |

FOREIGN PATENT DOCUMENTS

| | | |
|---|---|---|
| JP | 2006-222094 A | 8/2006 |
| JP | 3990232 B2 | 10/2007 |
| JP | 2008-089377 A | 4/2008 |
| JP | 4385498 B2 | 12/2009 |
| JP | 4585344 B2 | 11/2010 |
| JP | 4793203 B2 | 10/2011 |
| JP | 4930574 B2 | 5/2012 |
| JP | 5947466 B2 | 7/2016 |
| KR | 2001-0050489 A | 6/2001 |

* cited by examiner

UNIVERSAL TEST SOCKET, SEMICONDUCTOR TEST DEVICE, AND METHOD OF TESTING SEMICONDUCTOR DEVICES

CROSS-REFERENCE TO RELATED APPLICATIONS

This application claims priority under 35 U.S.C. § 119 to Korean Patent Application No. 10-2017-0087283, filed on Jul. 10, 2017, in the Korean Intellectual Property Office, the disclosure of which is incorporated herein in its entirety by reference.

BACKGROUND

The inventive concepts relate to universal test sockets, semiconductor test devices, and/or methods of testing semiconductor devices, and more particularly, to universal test sockets, semiconductor test devices, and methods of testing semiconductor devices which are applicable to various types of semiconductor devices and are capable of performing test in an improved and/or inexpensive manner.

A semiconductor device has to undergo various tests in order to check its reliability. A test socket used for the test of the semiconductor device includes terminals having one-to-one correspondence with terminals of the semiconductor device. If a semiconductor device to be tested is replaced with another semiconductor device, the test socket is desired to be replaced in accordance with the arrangement of the terminals of the replacement semiconductor device. Furthermore, even if only one of many terminals of the test socket has a problem, the test socket is desired to be replaced. Still further, time for attaching and detaching the test socket to a test device takes time.

SUMMARY

The inventive concepts provide universal test sockets which are applicable to various types of semiconductor devices and are capable of performing testing in an improved and/or inexpensive manner.

The inventive concepts also provide test devices which are capable of performing testing in an improved and/or inexpensive manner.

The inventive concepts also provide methods of testing semiconductor devices that are capable of performing testing in an improved and/or inexpensive manner.

According to an example embodiment, a universal test socket includes (1) a first sub-layer including a plurality of first through conductors, the plurality of first through conductors arranged at a first pitch in a first substrate, and (2) a second sub-layer including a plurality of second through conductors, the second sub-layer stacked on the first sub-layer so that the plurality of first through conductors are in contact with the plurality of second through conductors, the plurality of second through conductors arranged at a second pitch in a second substrate, the second pitch being less than or equal to the first pitch may be provided.

According to an example embodiment, a semiconductor test device includes (1) a test main body configured to test a semiconductor device, the test main body including a universal test socket, the universal test socket including a first sub-layer including a plurality of first through conductors, the plurality of first through conductors arranged at a first pitch in a first substrate, and a second sub-layer including a plurality of second through conductors, the second sub-layer stacked on the first sub-layer so that the plurality of first through conductors are in contact with the plurality of second through conductors, the plurality of second through conductors arranged at a second pitch in a second substrate, the first pitch and the second pitch being less than or equal to ½ of a pitch of terminals of the semiconductor device, and (2) a test control unit configured to control a test performed by the test main body.

According to an example embodiment, a method of testing semiconductor devices by using a semiconductor test device, which includes a test main body configured to test a semiconductor device and a test control unit configured to control a test performed by the test main body, includes placing a universal test socket on a test substrate, placing a plurality of semiconductor devices on the universal test socket, and applying a test signal to the plurality of semiconductor devices through the universal test socket.

BRIEF DESCRIPTION OF THE DRAWINGS

Example embodiments of the inventive concepts will be more clearly understood from the following detailed description taken in conjunction with the accompanying drawings in which.

DETAILED DESCRIPTION

Figure 1:
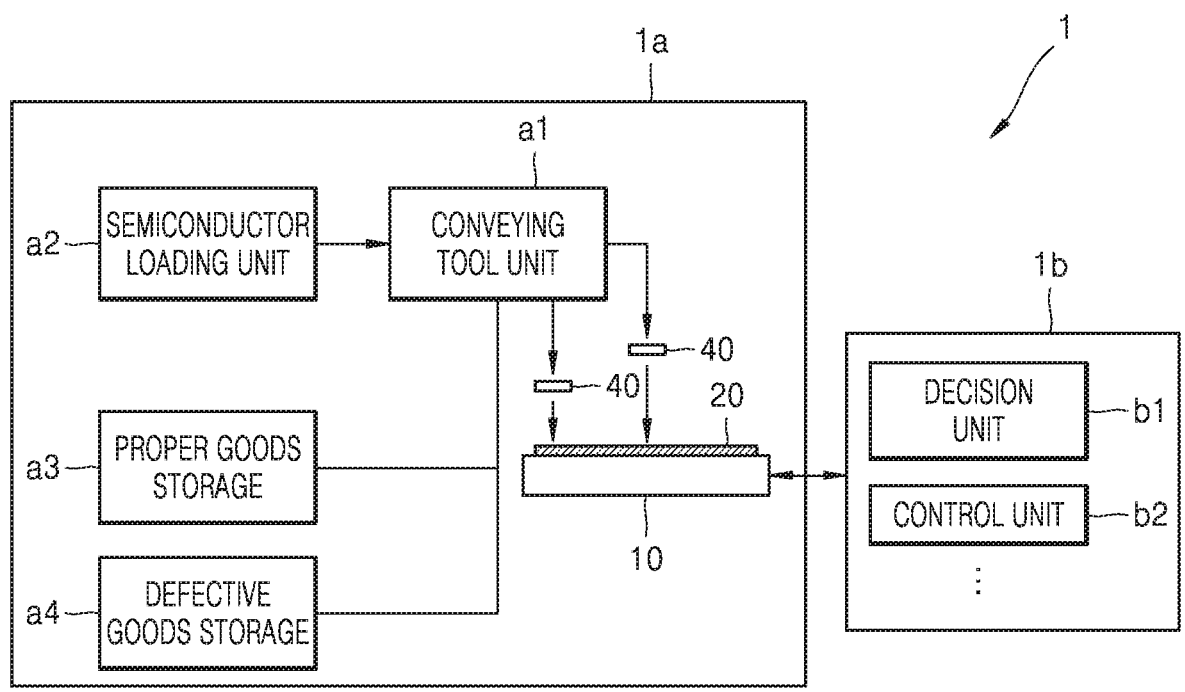
FIG. 1 is a block diagram showing a test device according to an example embodiment of the inventive concepts.

FIG. 1 is a block diagram of a test device 1 according to an example embodiment of the inventive concepts.

Referring to FIG. 1, the test device 1 may include a test main body 1a and a test controller 1b for controlling a test performed by the test main body 1a.

The test main body 1a is a portion where loading and conveying of a semiconductor device 40 to be tested and sorting of proper goods and defective goods are actually performed, and is referred to as a 'test handler unit' or a "test handler". Also, the test controller 1b transmits electric signals to the test main body 1a to determine whether the semiconductor device 40 is proper goods. The test controller 1b may be a processor configured to process computer readable instructions of, for example, a computer program by performing a basic arithmetic and logic operation, and an input/output (I/O) operation of the test device 1, thereby transforming the test controller 1b into a special purpose processor. The computer readable instructions may be stored on a memory or other storage medium. The test controller 1b may run an operating system (OS) and one or more software applications or computer programs that run on the OS. The test controller 1b also may access, store, manipulate, process, and create data in response to execution of the computer program. Referring to the example embodiment depicted in FIG. 1, the test controller 1b includes a decision unit b1 and a control unit b2.

In the present example embodiment, the test main body 1a includes a test substrate 10 on which a universal test socket 20 is provided, a semiconductor loading unit a2 for loading and storing a semiconductor device, and a conveying tool unit a1 conveying the semiconductor device in the semiconductor loading unit a2 to the universal test socket 20 on the test substrate 10 so that the semiconductor device is in contact with the universal test socket 20.

The conveying tool unit a1 conveys a semiconductor chip that has been tested on the test substrate 10 to a proper goods storage a3 or a defective goods storage a4. Here, determination whether the tested semiconductor device is defective or not is performed by the test controller 1b, and according to the determination of the test controller 1b, the conveying tool unit a1 sorts the semiconductor device into proper goods or defective goods and conveys the semiconductor device to the proper goods storage a3 or the defective goods storage a4.

An operator may accommodate semiconductor devices 40 to be tested in, for example, accommodation compartments of a tray, and locate the semiconductor devices 40 in the semiconductor loading unit a2 of the test main body 1a. Next test processes may be performed automatically, that is, the conveying tool unit a1 conveys the semiconductor devices 40 on the tray onto the universal test socket 20 of the test substrate 10 so that the semiconductor devices 40 are in contact with the universal test socket 20. In addition, the test controller 1b transmits an electric signal to the universal test socket 20 to determine whether the semiconductor devices 40 are defective. The test main body 1a that receives a determination result places the proper goods in the proper goods storage a3 and the defective goods in the defective goods storage a4 by using the conveying tool unit a1 included therein, and then, the test is finished.

Figure 2:
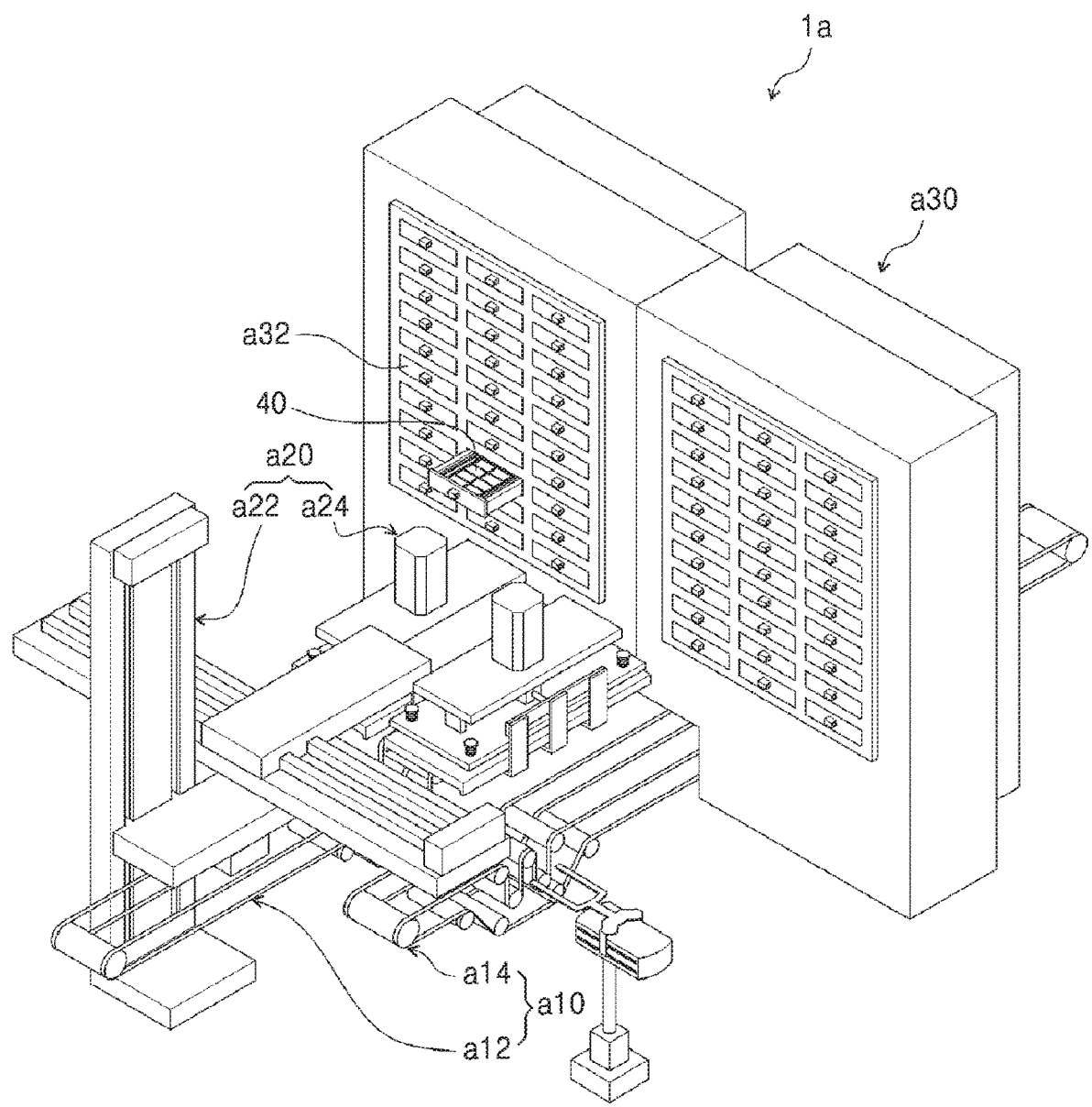
FIG. 2 is a perspective view of a main body of the test device according to the example embodiment of the inventive concepts.

FIG. 2 is a perspective view of the test main body 1a included in the test device 1 according to the example embodiment of the inventive concepts.

Referring to FIG. 2, the test main body 1a may include a conveyor unit a10, a transfer unit a20, and a test unit a30.

The conveyor unit a10 may convey the semiconductor device 40. The conveyor unit a10 may include a supply conveyor a12 and a discharge conveyor a14. The supply conveyor a12 conveys the semiconductor device 40 to the transfer unit a20. The discharge conveyer a14 may transfer the semiconductor device 40 from the transfer unit a20 to an unloader.

The transfer unit a20 may load and/or unload the semiconductor device 40 to be tested onto/from the test unit a30. The transfer unit a20 may include a lift unit a22 and a robot unit a24. The lift unit a22 may elevate the semiconductor device 40 between the supply conveyor a12 and the robot unit a24. The robot unit a24 may transfer the semiconductor device 40 between the lift unit a22 and the test unit a30.

The test unit a30 provides the semiconductor device 40 with a test environment and a test space. The test unit a30 may include, for example, a drawer a32, and one or more semiconductor devices 40 may be accommodated in the drawer a32. The robot unit a24 may open or close the drawer a32 of the test unit a30. In FIG. 2, the test unit a30 has a drawer structure, but example embodiments are not limited thereto.

Figure 3:
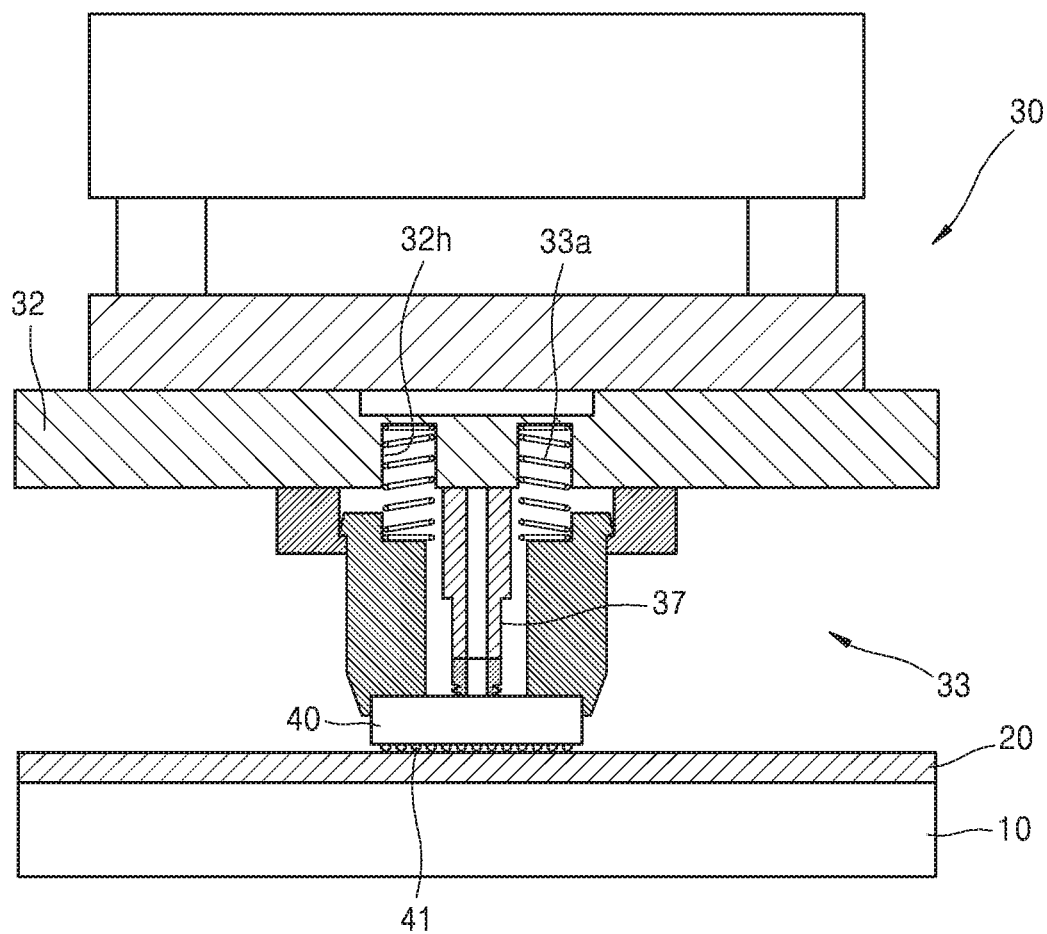
FIG. 3 is a side-sectional view illustrating a method of testing a semiconductor device, according to an example embodiment of the inventive concepts.

FIG. 3 is a side-sectional view illustrating a method of testing the semiconductor device 40, according to an example embodiment of the inventive concepts.

Referring to FIG. 3, the test device 1 for testing the semiconductor device 40 may be configured so that the universal test socket 20 is disposed on the test substrate 10 and the semiconductor device 40 placed on the universal test socket 20 may be compressed downwardly by using a pusher device 30. The pusher device 30 compresses the semiconductor device 40 downwardly so that terminals 41 of the semiconductor device 40 definitely contacts terminals of the universal test socket 20.

The pusher device 30 may include a support plate 32, a guide member 33, and a pushing member 37.

The support plate 32 supports the guide member 33 and the pushing member 37, and a plurality of receiving recesses 32h that respectively receive upper ends of elastic members 33a of the guide member 33 may be formed in a lower surface of the support plate 32. The elastic members 33a are respectively received in the receiving recesses 32h, and may be prevented from escaping the receiving recesses 32h.

The guide member 33 is disposed on the lower surface of the support plate 32, and the pushing member 37 is provided on the lower surface of the support plate 32 in a state of being inserted in a center hole of the guide member 33 in order to push the semiconductor device 40 so that the terminal 41 of the semiconductor device 40 firmly contacts the terminal of the universal test socket 20.

In some example embodiments, the test substrate 10 may be, for example, a printed circuit board. On an upper surface of the test substrate 10, a plurality of terminals may be two-dimensionally arranged. The terminals (not shown) may be a metal such as nickel, copper, aluminum, etc. or a metal alloy, and may be electrically connected to wirings extending along the inside or the surface of the test substrate 10.

The terminals may include at least one ground terminal. Further, the test substrate 10 may have a ground line extending along at least one row of the two-dimensionally arranged terminals. The ground line (not shown) may be provided on the upper surface of the test substrate 10.

Figure 4:
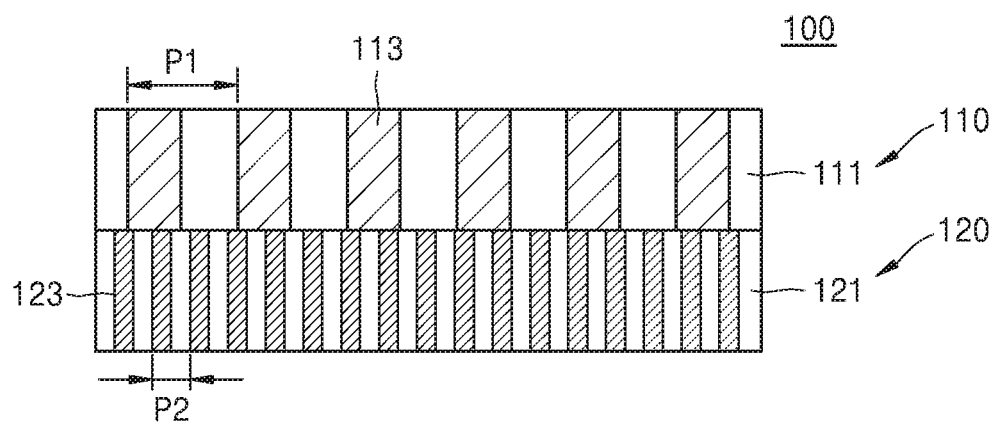
FIG. 4 is a side cross-sectional view conceptually showing a universal test socket according to an example embodiment of the inventive concepts.

FIG. 4 is a side cross-sectional view conceptually showing a universal test socket 100 according to an example embodiment of the inventive concepts.

Referring to FIG. 4, the universal test socket 100 may include a first sub-layer 110 and a second sub-layer 120. The first sub-layer 110 and the second sub-layer 120 may be stacked on each other.

The first sub-layer 110 may include a plurality of first through conductors 113 arranged at a first pitch P1 in a first substrate (also referred to as a first base) 111. The second sub-layer 120 may include a plurality of second through conductors 123 arranged at a second pitch P2 in a second substrate (also referred to as a second base) 121. At this time, the second pitch P2 is less than or equal to the first pitch P1.

In some example embodiments, the second pitch P2 may be less than or equal to ½ of the first pitch P1. The first pitch P1 may be from about 15 micrometers to about 70 micrometers, from about 15 micrometers to about 50 micrometers, from about 20 micrometers to about 50 micrometers, or from about 25 micrometers to about 40 micrometers. The second pitch P2 may be from about 5 micrometers to about 30 micrometers, from about 5 micrometers to about 25 micrometers, from about 10 micrometers to about 25 micrometers, or from about 10 micrometers to about 20 micrometers.

If the second pitch P2 is less than ½ of the first pitch P1, the first through conductors 113 and the second through conductors 123 may be in contact with each other and may be electrically connected to each other without precisely aligning the first through holes conductors 113 of the first sub-layer 110 with the second through conductors 123 of the second sub-layer 120.

The first through conductors 113 extend in a thickness direction of the first base 111 through the first base 111 and may be formed in various shapes using various materials. This will be described in detail below.

In FIG. 4, the second through conductors 123 extend through the second base 121 in a thickness direction of the second base 121 and extend in a direction perpendicular to a main surface of the second base 121. However, the second through conductors 123 may not extend in the vertical direction. For example, the second through conductors 123 may extend in a direction inclined with respect to the main surface of the second base 121. This will be described in detail below.

The first pitch P1 of the first through conductors 113 and the second pitch P2 of the second through conductors 123 may be less than or equal to ½ of a pitch P3 (see FIG. 7) of terminals of a semiconductor package to be tested.

In some example embodiments, the first pitch P1 may be from about 1/1000 to about ½ of the pitch P3 of the terminals. In some example embodiments, the first pitch P1 may be from about 1/500 to about ½ of the pitch P3 of the terminals. In some example embodiments, the first pitch P1 may be from about 1/200 to about ⅓ of the pitch P3 of the terminals. In some example embodiments, the first pitch P1 may be from about 1/100 to about ⅕ of the pitch P3 of the terminals. In some example embodiments, the first pitch P1 may be from about 1/50 to about ⅛ of the pitch P3 of the terminals.

In some example embodiments, the second pitch P2 may be from about 1/10000 to about ½ of the pitch P3 of the terminals. In some example embodiments, the second pitch P2 may be from about 1/1000 to about 1/2.5 of the pitch P3 of the terminals. In some example embodiments, the second pitch P2 may be from about 1/500 to about ⅕ of the pitch P3 of the terminals. In some example embodiments, the second pitch P2 may be from about 1/200 to about 1/10 of the pitch P3 of the terminals. In some example embodiments, the second pitch P2 may be from about 1/100 to about 1/20 of the pitch P3 of the terminals.

The first sub-layer 110 may be configured to be removable from the second sub-layer 120. For example, the first sub-layer 110 and the second sub-layer 120 may be configured to be removable from each other so that only a defective one of the first sub-layer 110 and the second sub-layer 120 is substituted. The first substrate 111 of the first sub-layer 110 and the second substrate 121 of the second sub-layer 120 may be made of a polymer. Materials and physical properties of the first substrate 111 and the second substrate 121 may be chosen so that the first substrate 111 and the second substrate 121 have a van der Waals force sufficient to combine with each other.

Hereinafter, the first sub-layer 110 and the second sub-layer 120 will be described separately.

First Sub-Layer

The first sub-layer 110 has the first substrate 111 and the plurality of first through conductors 113 extending therethrough as described above.

FIGS. 5A to 5D are conceptual diagrams showing main parts of first sub-layers 110a, 110b, 110c, and 110d according to some example embodiments of the inventive concepts.

Figure 5A:
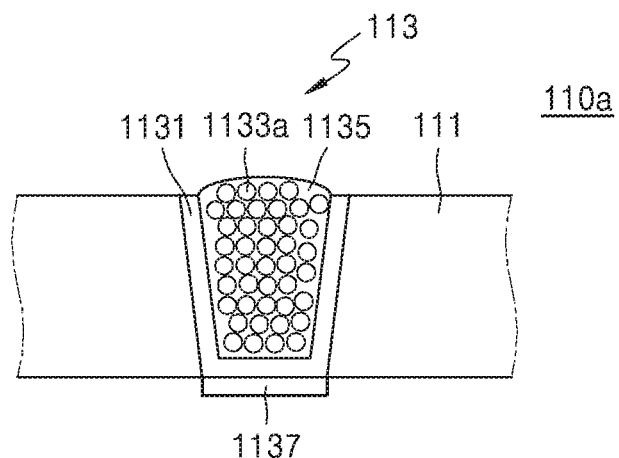
FIGS. 5A to 5D are conceptual diagrams showing main parts of first sub-layers according to some example embodiments of the inventive concepts.

Referring to FIG. 5A, a concave electrode 1131 may be formed to penetrate the first sub-layer 110a.

The first substrate 111 may be formed of any one of polyimide resin, epoxy resin, polyethylene terephthalate, polybutylene terephthalate, polyvinyl chloride, polystyrene, polyethylene, polyacrylonitrile, polypropylene, acrylic resin, polybutadiene, polyphenylene Butadiene copolymer, acrylonitrile-butadiene copolymer, styrene-isoprene copolymer, chloroprene, polyurethane, polyester, silicone, polyurethane, ethylene-propylene copolymer, ethylene-propylene-diene copolymer, or the like, and is not particularly limited.

The concave electrode 1131 may be made of at least one selected from the group consisting of copper (Cu), nickel (Ni), gold (Au), silver (Ag), platinum (Pt), tungsten (W), molybdenum (Mo), iron (Fe), cobalt (Co), aluminum (Al), palladium (Pd), titanium (Ti) and alloys thereof, and may define a concave recess. In some example embodiments, the concave electrode 1131 may be coated with a conductor having a high oxidation resistance such as gold (Au) or platinum (Pt).

The concave electrode 1131 may be filled with conductive powder 1133a, for example, micro powder. A flexible and elastic binder 1135 such as silicone resin may be provided in the recess to fix the conductive powder 1133a.

The conductive powder 1133a may be a conductive particle having a diameter of about several micrometers or less. For example, the conductive powder 1133a may have a structure in which metal is coated on a core. The core may be a metal such as nickel or may be a fine particle made of a polymer resin. The core may have a shape of a sphere or that is close to a sphere, but example embodiments are not limited thereto. The metal coated on the core may be at least one selected from the group consisting of copper (Cu), nickel (Ni), gold (Au), silver (Ag), platinum (Pt), tungsten (W), molybdenum (Mo), iron (Fe), cobalt (Co), aluminum (Al), palladium (Pd), titanium (Ti) and alloys thereof.

In another embodiment, the conductive powder 1133a may be a fine particle of metal itself. For example, the conductive powder 1133a may be formed of at least one selected from the group consisting of copper (Cu), nickel (Ni), gold (Au), silver (Ag), platinum (Pt), tungsten (W), molybdenum (Al), palladium (Pd), titanium (Ti), and alloys thereof, and may have a diameter of about several micrometers or less.

A lower coating layer 1137 may be provided on a lower portion of the concave electrode 1131. The lower coating layer 1137 may be formed of a different kind of metal from the concave electrode 1131 and may include a metal having high oxidation resistance such as gold (Au) and platinum (Pt).

As shown in FIG. 5A, an upper surface of the first through conductor 113 may protrude slightly beyond an upper surface of the first base 111. This is to facilitate contact with other conductors in contact with an upper portion of the first sub-layer 110a, and the binder 1135 may have a viscoelastic property capable of proper deformation by an applied force, and thus the first through conductor 113 may have excellent electrical contact with other conductors.

Figure 5B:
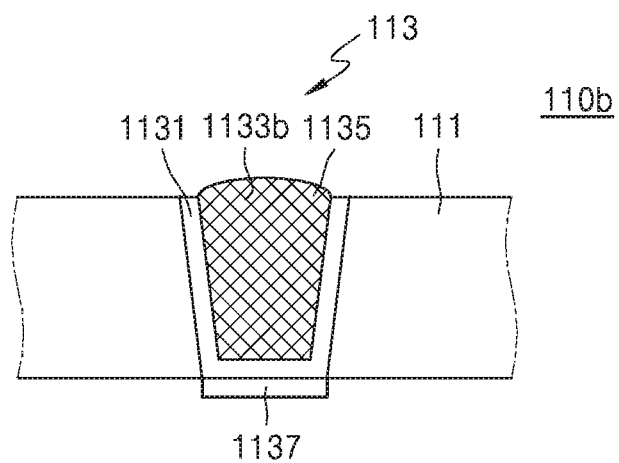

Referring to FIG. 5B, the first sub-layer 110b differs from the embodiment described with reference to FIG. 5A in that carbon-based nanostructures 1133b are used instead of the conductive powder 1133a as a conductor. The first sub-layer 110b may be the same as or substantially similar to the example embodiment described with reference to FIG. 5A in other respects. Therefore, differences will be mainly described and redundant descriptions about common parts are omitted.

The carbon-based nanostructures 1133b may be a single wall carbon nanotube (SWCNT), a multiple wall carbon nanotube (MWCNT), a vertically aligned carbon nanotube, VACNTs, graphene, fullerene, carbon nano-rods, and the like, but example embodiments are not limited thereto.

The carbon-based nanostructures 1133b may be coupled by the binder 1135 and may be located in the concave electrode 1131. In this case as well, the upper surface of the first through conductor 113 may protrude slightly beyond the upper surface of the first substrate 111, as in FIG. 5A.

Figure 5C:
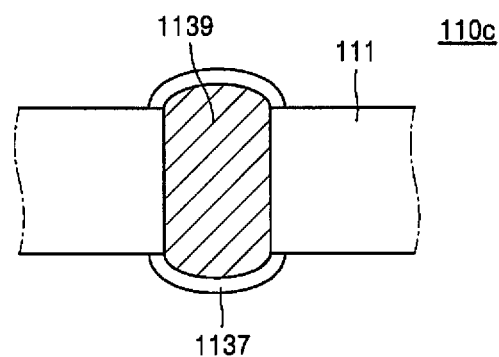

Referring to FIG. 5C, a microbump array 1139 may be provided to penetrate the first sub-layer 110c. The microbump array 1139 may be formed by arranging bumps of a metal conductor at a desired (or alternatively, predetermined) constant interval. In some example embodiments, the microbump array 1139 may protrude symmetrically on upper and lower surfaces of the first sub-layer 110c.

The microbump array 1139 may be formed of at least one selected from the group consisting of, for example, tin (Sn), copper (Cu), nickel (Ni), gold (Au), silver (Ag), platinum (Pt), tungsten (W), molybdenum (Mo), iron (Fe), bismuth (Bi), cobalt (Co), aluminum (Al), palladium (Pd), titanium (Ti), tantalum (Ta), and alloys thereof. Further, the surface of the microbump array 1139 may be provided with a coating layer 1137. The coating layer 1137 may be formed of a different kind of metal from the microbump array 1139 and may include a metal having high oxidation resistance such as gold (Au) and platinum (Pt)

Figure 5D:
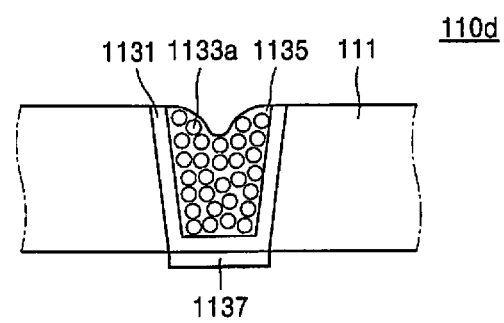

Referring to FIG. 5D, the first through conductor 113 differs from the embodiment of FIG. 5A in that a profile of an upper surface of the first through conductor 113 is concave into a recess. The first through conductor 113 may be the same as or substantially similar to the example embodiment described with reference to FIG. 5A in other respects. Therefore, differences will be mainly described and redundant descriptions about common parts are omitted.

By concavely forming the profile of the upper surface of the first sub-layer 110d, compatibility with another conductor protruding convexly and provided thereon may be enhanced.

Second Sub-Layer

The second sub-layer 120 has a second substrate 121 and a plurality of second through conductors 123 extending therethrough.

FIGS. 6A to 6D are conceptual diagrams showing main parts of second sub-layers 120a, 120b, 120c, and 120d according to some example embodiments of the inventive concepts.

Figure 6A:
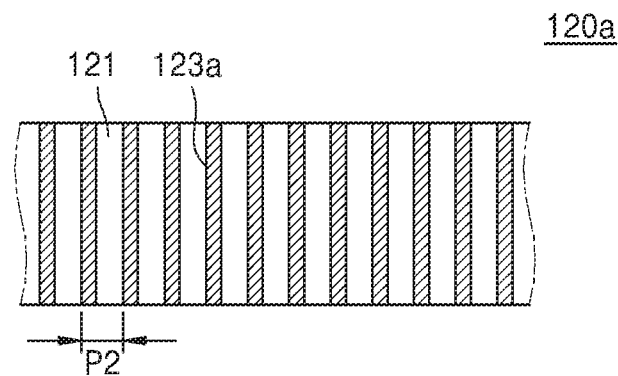
FIGS. 6A to 6D are conceptual diagrams showing main parts of second sub-layers according to some example embodiments of the inventive concepts.

Referring to FIG. 6A, the second sub-layer 120a may include the second substrate 121 and a plurality of wire pins 123a extending therethrough. The wire pins 123a may be formed of at least one selected from the group consisting of copper (Cu), nickel (Ni), gold (Au), silver (Ag), platinum (Pt), tungsten (W), molybdenum (Mo), iron (Fe), cobalt (Co), aluminum (Al), palladium (Pd), titanium (Ti), and alloys thereof, and may have a diameter from about 5 micrometers to about 20 micrometers. The wire pins 123a may be apart from each other by the second pitch P2.

The second substrate 121 may be formed of any one of polyimide resin, epoxy resin, polyethylene terephthalate, polybutylene terephthalate, polyvinyl chloride, polystyrene, polyethylene, polyacrylonitrile, polypropylene, acrylic resin, polybutadiene, polyphenylene Butadiene copolymer, acrylonitrile-butadiene copolymer, styrene-isoprene copolymer, chloroprene, polyurethane, polyester, silicone, polyurethane, ethylene-propylene copolymer, ethylene-propylene-diene copolymer, and the like, and is not particularly limited.

A thickness of the second substrate 121 may be from about 50 micrometers to about 500 micrometers, or from about 100 micrometers to about 300 micrometers.

Figure 6B:
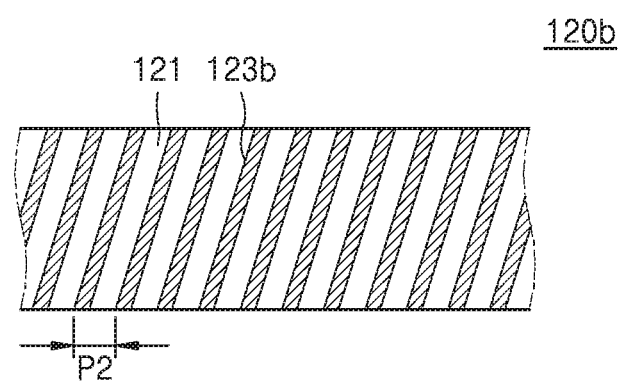

FIG. 6B is the same as the embodiment of FIG. 6A except that wire pins 123b are inclined. Therefore, differences will be described mainly, and redundant descriptions about common parts are omitted.

An inclination angle of the wire pins 123b may be from about 5 to about 20 degrees, but example embodiments are not limited thereto. If the wire pins 123b are inclined, because it may be deformed more flexibly with respect to a force applied in a vertical direction, improved contact may be secured even by a small force.

If a degree of inclination of the wire pins 123b is too large, matching between terminals of a package under test and test terminals located below may be deteriorated. On the other hand, if the degree of inclination of the wire pins 123b is too small, the advantage of excellent contact as stated above may be insufficient.

Figure 6C:
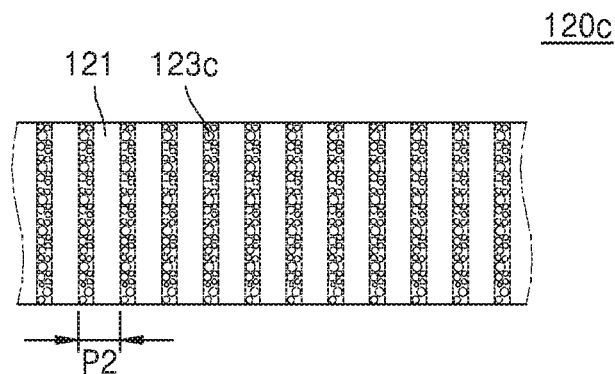

FIG. 6C is the same as the embodiment of FIG. 6A except that the second sub-layer 120c includes an array of fine conductive particles arranged as a second through conductor 123c. Therefore, differences will be described mainly, and redundant descriptions about common parts are omitted.

The second pitch P2 of the second through conductors 123c may be smaller than the first pitch P1 of the first through conductors 113. For example, the second pitch P2 of the second through conductor 123c may be from about 1/100 to about 1/2 of the first pitch P1 of the first through conductor 113.

The fine conductive particles may have a structure in which a metal is coated on a core. The core may be a metal such as nickel or may be a fine particle made of a polymer resin. The core may have a shape of a sphere or that is close to a sphere, but example embodiments are not limited thereto. The metal to be coated on the core may be at least one selected from the group consisting of copper (Cu), nickel (Ni), gold (Au), silver (Ag), platinum (Pt), tungsten (W), molybdenum (Mo), iron (Fe), cobalt (Co), aluminum (Al), palladium (Pd), titanium (Ti), and alloys thereof.

In another embodiment, the fine conductive particles may be fine particles of the metal itself. For example, the fine conductive particles may be at least one selected from the group consisting of copper (Cu), nickel (Ni), gold (Au), silver (Ag), platinum (Pt), tungsten (W), molybdenum (Mo), iron (Fe), cobalt (Co), aluminum (Al), palladium (Pd), titanium (Ti), and alloys thereof, and may be fine particles having a diameter of about several micrometers or less.

Figure 6D:
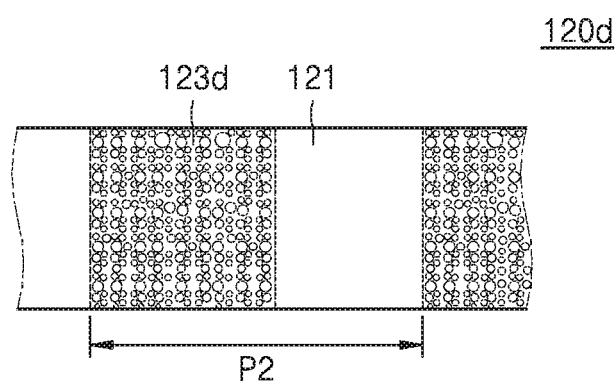

FIG. 6D is the same as the embodiment of FIG. 6A except that the second sub-layer 120d includes an array of fine conductive particles arranged as a second through conductor 123d. Therefore, a difference will be described mainly, and redundant descriptions about common parts are omitted.

The second pitch P2 of the second through conductors 123d may be substantially the same as the first pitch P1 of the first through conductors 113.

Figure 7:
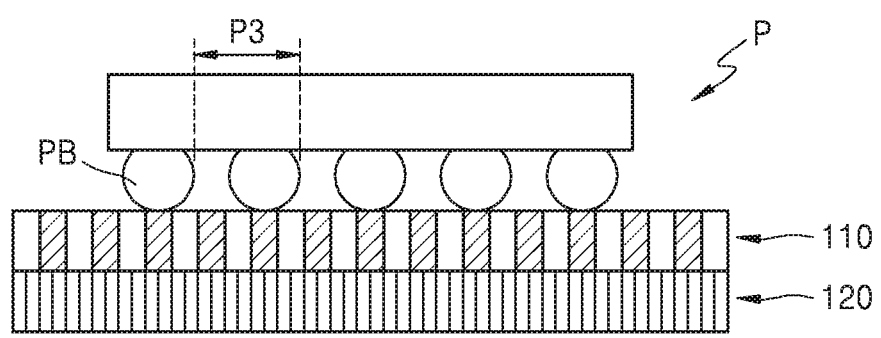
FIG. 7 is a conceptual diagram showing a semiconductor package in contact with a universal test socket.

FIG. 7 is a conceptual diagram showing a semiconductor package P in contact with the universal test socket 100.

Referring to FIG. 7, terminals PB of the semiconductor package P have a third pitch P3, which may be larger than a first pitch of through conductors in the first sub-layer 110 and a second pitch of through conductors in the second sub-layer 120. In some example embodiments, the third pitch P3 may be at least twice the first pitch.

If the first pitch is sufficiently small compared to the third pitch P3, the terminals PB of the semiconductor package P may be in contact with the through conductors in the first sub-layer 110 even when the terminals PB of the semiconductor package P are not precisely aligned with the through conductors in the first sub-layer 110.

The semiconductor package P may include a logic device such as a central processing unit (CPU), an application processor (AP), and the like. In some example embodiments, the semiconductor package P may include a volatile memory device such as DRAM, SRAM, etc., a non-volatile memory device such as a flash memory device, PRAM, MRAM, RRAM.

Figure 8A:
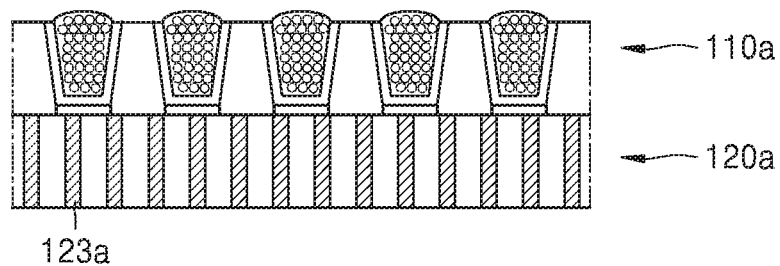
FIGS. 8A through 8P are side cross-sectional views showing universal test sockets according to some example embodiments of the inventive concepts.
Figure 8B:
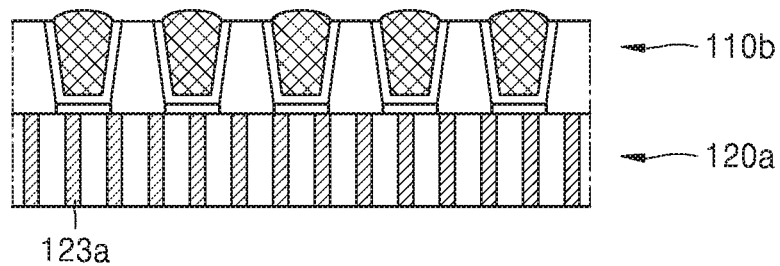
Figure 8C:
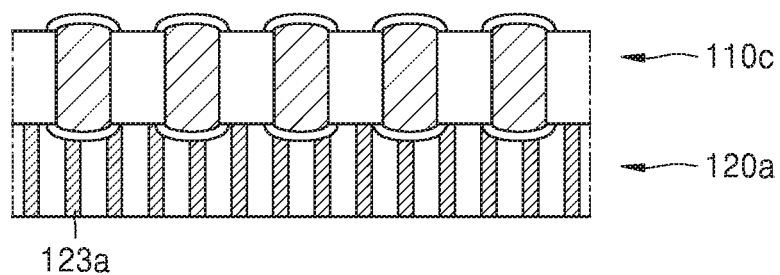
Figure 8D:
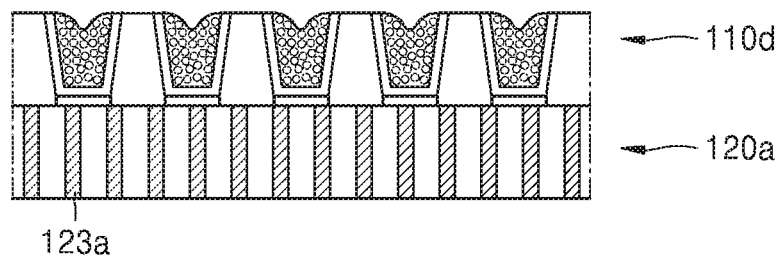
Figure 8E:
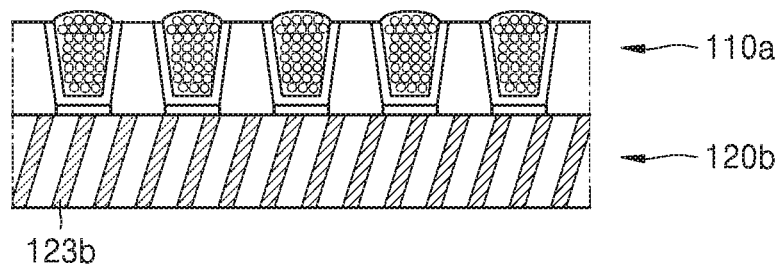
Figure 8F:
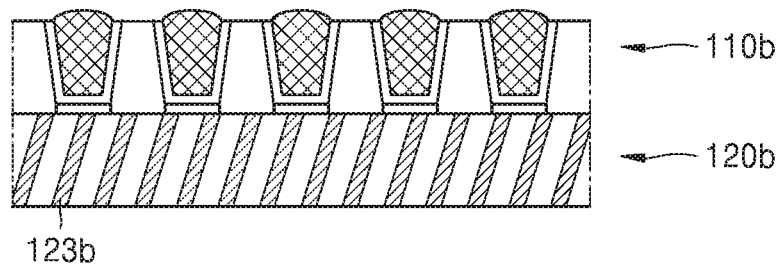
Figure 8G:
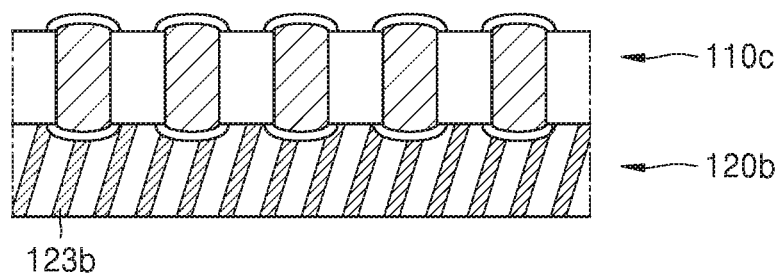
Figure 8H:
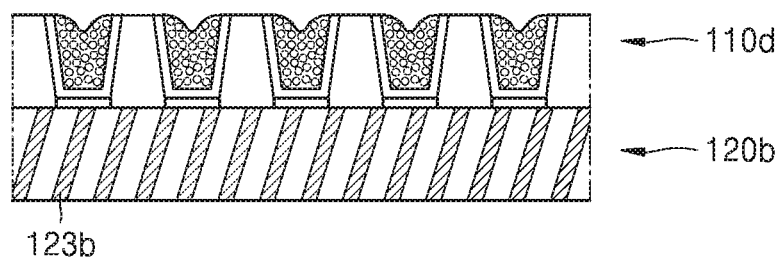
Figure 8I:
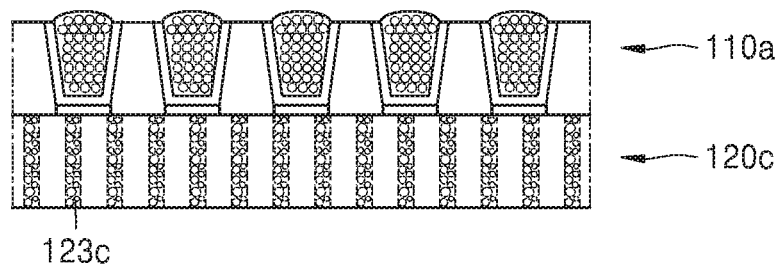
Figure 8J:
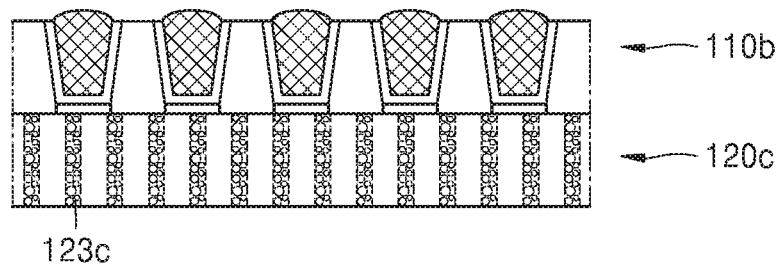
Figure 8K:
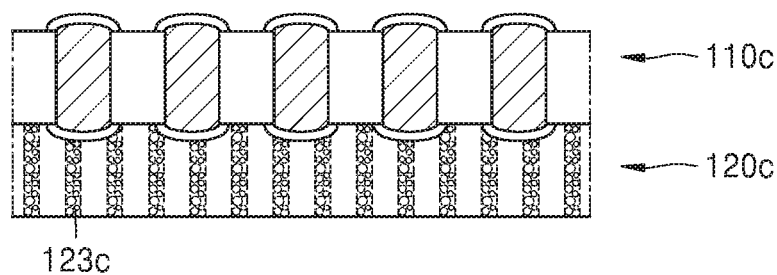
Figure 8L:
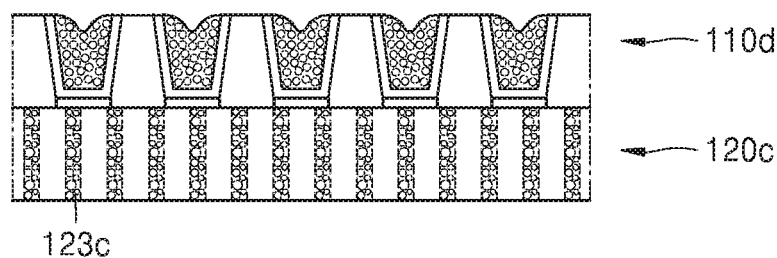
Figure 8M:
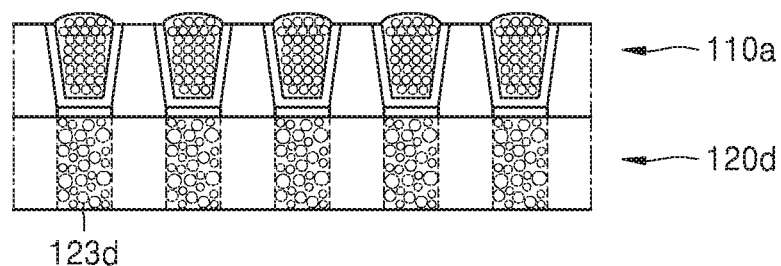
Figure 8N:
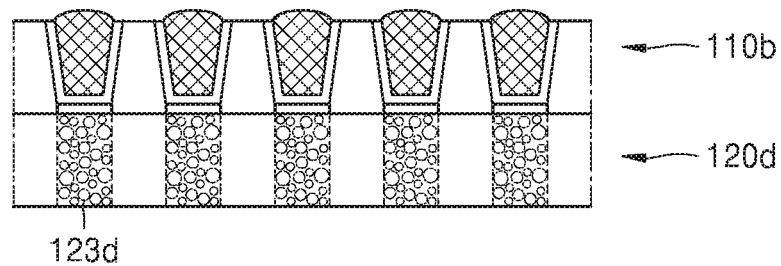
Figure 8O:
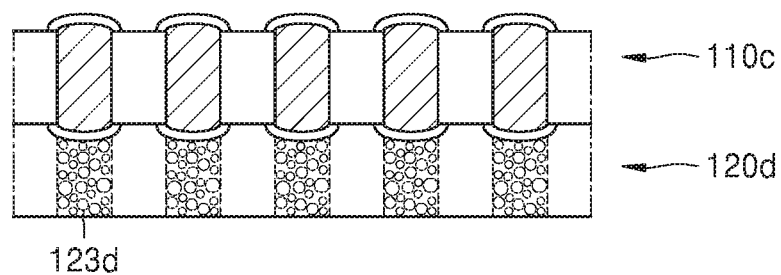
Figure 8P:
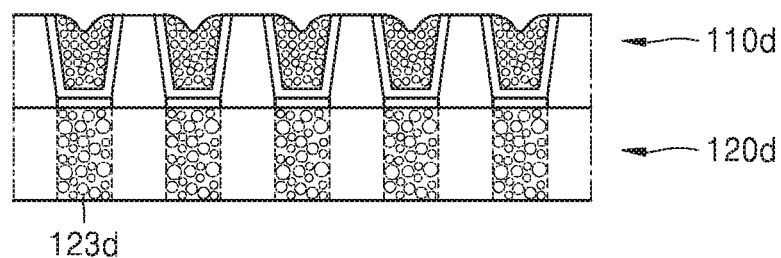

FIGS. 8A through 8P are side cross-sectional views showing the universal test sockets 100 according to some example embodiments of the inventive concepts.

In FIGS. 8A to 8D, the second sub-layer 120a described with reference to FIG. 6A is used as a second sub-layer. In FIGS. 8A to 8D, the first sub-layers 110a, 110b, 110c, and 110d described with reference to FIGS. 5A to 5D are used as first sub-layers, respectively.

As shown in FIGS. 8A to 8D, although the first sub-layers 110a, 110b, 110c, and 110d are not precisely aligned with the second sub-layer 120a, through conductors in the first sub-layers 110a, 110b, 110c, and 110d contacts at least one of the through conductors 123a in the second sub-layer 120a. Thus, the through conductors in the first sub-layers 110a, 110b, 110c, and 110d are not desired to precisely align with the through conductors 123a in the second sub-layer 120a.

In FIGS. 8E to 8H, the second sub-layer 120b described with reference to FIG. 6B is used as a second sub-layer. In FIGS. 8E to 8H, the first sub-layers 110a, 110b, 110c, and 110d described with reference to FIGS. 5A to 5D are used as first sub-layers, respectively.

As shown in FIGS. 8E to 8H, through conductors in the first sub-layers 110a, 110b, 110c, and 110d are not precisely aligned with the through conductors 123b in the second sub-layer 120b as also described with reference to FIGS. 8A to 8D.

In FIGS. 8I to 8L, the second sub-layer 120c described with reference to FIG. 6C is used as the second sub-layer 120c. In FIGS. 8I to 8L, the first sub-layers 110a, 110b, 110c, and 110d described with reference to FIGS. 5A to 5D are used as first sub-layers, respectively.

As shown in FIGS. 8I to 8L, through conductors in the first sub-layers 110a, 110b, 110c, and 110d are not precisely aligned with the through conductors 123c in the second sub-layer 120c as also described with reference to FIGS. 8A to 8D.

In FIGS. 8M to 8P, the second sub-layer 120d described with reference to FIG. 6D is used as the second sub-layer 120d. In FIGS. 8M to 8P, the first sub-layers 110a, 110b, 110c, and 110d described with reference to FIGS. 5A to 5D are used as first sub-layers, respectively.

Referring to FIGS. 8M to 8P, through conductors of the first sub-layers 110a, 110b, 110c, and 110d correspond to through conductors of the second sub-layer 120d. In other words, the through conductors of the first sub-layer 110a, 110b, 110c, and 110d may have the same pitch as the through conductors 123d of the second sub-layer 120d. In this case, because a cross-sectional area of an electrical conduction is widened, a more stable signal transmission may be achieved electrically.

FIGS. 9A through 9D are cross-sectional views illustrating test sockets according to some example embodiments of the inventive concepts.

FIGS. 8A through 8P show embodiments of a two layer structure in which one first sub-layer and one second sub-layer are stacked to each other, while FIGS. 9A through 9D show embodiments of a three layer structure in which two first sub-layers and one second sub-layer are stacked or one first sub-layer and two second sub-layers are stacked.

Figure 9A:
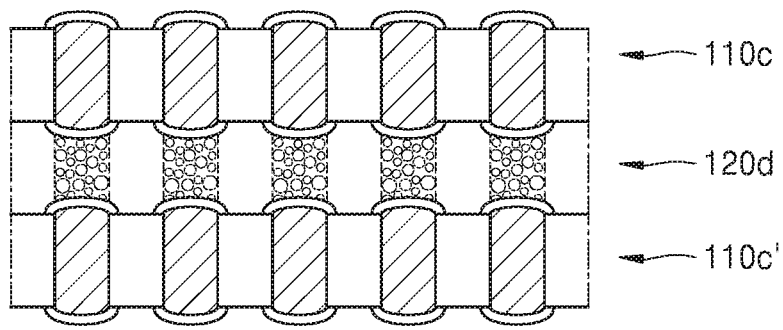
FIGS. 9A through 9D are cross-sectional views illustrating test sockets according to some example embodiments of the inventive concepts.

Referring to FIG. 9A, the first sub-layer 110c and the second sub-layer 120d below the first sub-layer 110c may be stacked and additionally a third sub-layer 110c' that is the same as the first sub-layer 110c may be disposed below the second sub-layer 120d.

Figure 9B:
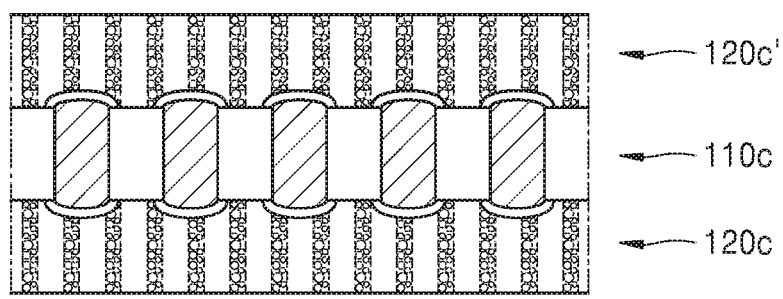

Referring to FIG. 9B, the second sub-layer 120c may be disposed below the first sub-layer 110c and a fourth sub-layer 120c' that is the same as the second sub-layer 120c may be further disposed on the first sub-layer 110c.

Figure 9C:
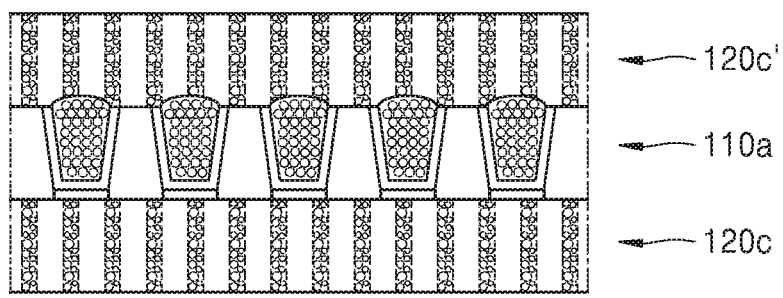

Referring to FIG. 9C, the second sub-layer 120c may be disposed below the first sub-layer 110a and the fourth sub-layer 120c' that is the same as the second sub-layer 120c may be further disposed on the first sub-layer 110a.

Figure 9D:
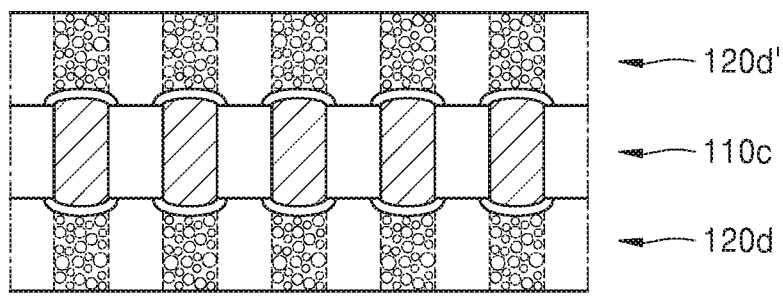

Referring to FIG. 9D, the second sub-layer 120d may be disposed below the first sub-layer 110c and a fifth sub-layer 120d' that is the same as the second sub-layer 120d may be further disposed on the first sub-layer 110a.

As described above, sub-layers are composed of three layers, a force applied from a semiconductor device may be effectively dispersed, and lifetime of through conductors of each sub-layer may be increased.

Figure 10A:
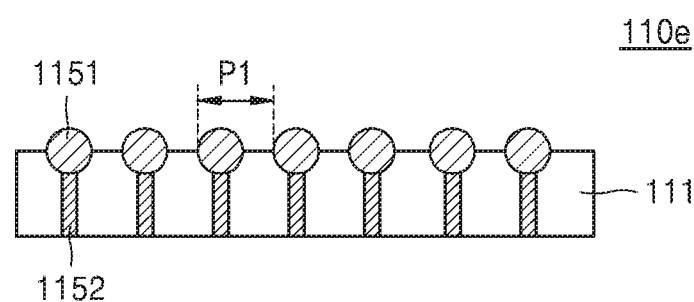
FIGS. 10A and 10B are side cross-sectional views illustrating first sub-layers according to other some example embodiments of the inventive concepts.
Figure 10B:
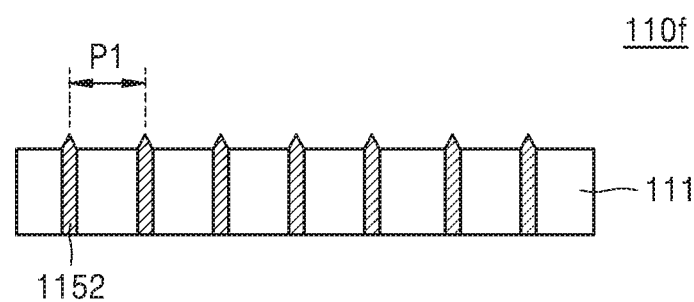
Figure 11A:
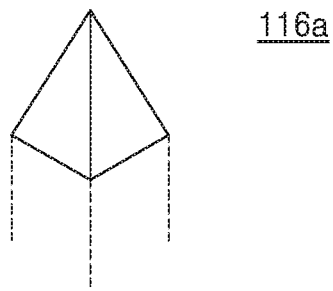
FIGS. 11A to 11E are partial perspective views showing various examples of needles.
Figure 11B:
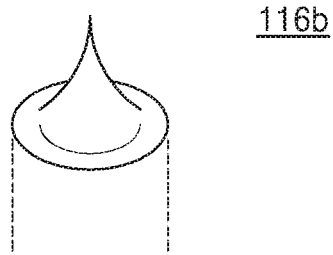
Figure 11C:
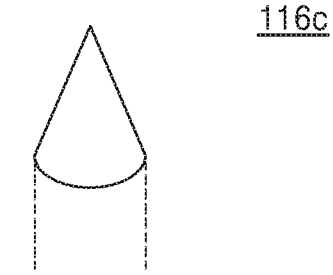
Figure 11D:
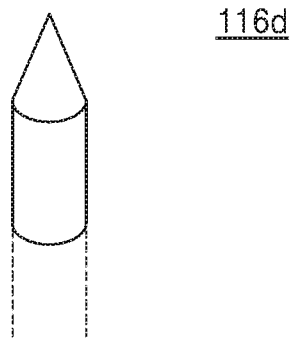
Figure 11E:
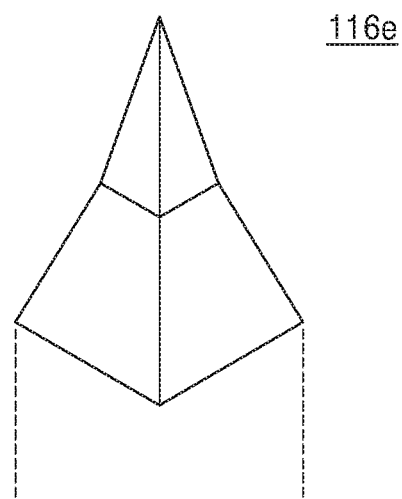

FIGS. 10A and 10B are side cross-sectional views illustrating first sub-layers 110e and 110f according to other some example embodiments of the inventive concepts.

Referring to FIG. 10A, conductor pillars 1152 may extend in a vertical direction in the first base 111, and beads 1151 may be provided at distal ends of the conductor pillars 1152, respectively. In FIG. 10A, the beads 1151 are shown as being separate from the conductor pillars 1152, but they may be provided integrally.

The beads 1151 and the conductor pillars 1152 may be made of a metal and may be made of at least one selected from the group consisting of copper (Cu), nickel (Ni), gold (Au), silver (Ag), platinum (Pt), tungsten (W), molybdenum (Mo), iron (Fe), cobalt (Co), aluminum (Al), palladium (Pd), titanium (Ti), and alloys thereof.

The beads 1151 may be arranged with the first pitch P1 and the first pitch P1 may be equal to or less than ½ of a pitch of terminals of a semiconductor device to be tested as described above.

When bumps of the semiconductor device are in contact with the beads 1151, the bumps slightly slide while receiving a shearing force along surfaces of the beads 1151. In this process, a native oxide of bump surfaces may be removed by friction. Whereby an electrical signal may be more smoothly transmitted.

Referring to FIG. 10B, needles may be formed at the distal ends of the conductor pillars 1152 instead of the beads 1151. FIGS. 11A to 11E are partial perspective views showing various examples of the needles. In FIGS. 11A to 11E, a portion indicated with a solid line denotes a portion exposed on an upper surface of the first substrate 111, and a portion indicated with a dotted line denotes a portion buried under the upper surface of the first substrate 111.

Referring to FIGS. 11A to 11E, the needles have various shapes such as a pyramidal needle 116a, a side concave conical needle 116b, a conical needle 116c, a needle 116d in the form of a combination of a cylinder and a cone, a double pyramidal needle 116e, and the like. These may be manufactured by subjecting the pillars 1152 to polishing, plasma treatment, sputtering or the like.

The use of the first sub-layer 110f having the needle-shaped pillars 1152 having sharp points as described above may help remove a native oxide on bump surfaces when bumps of a semiconductor device are contacted by the first sub-layer 110f.

Figure 12:
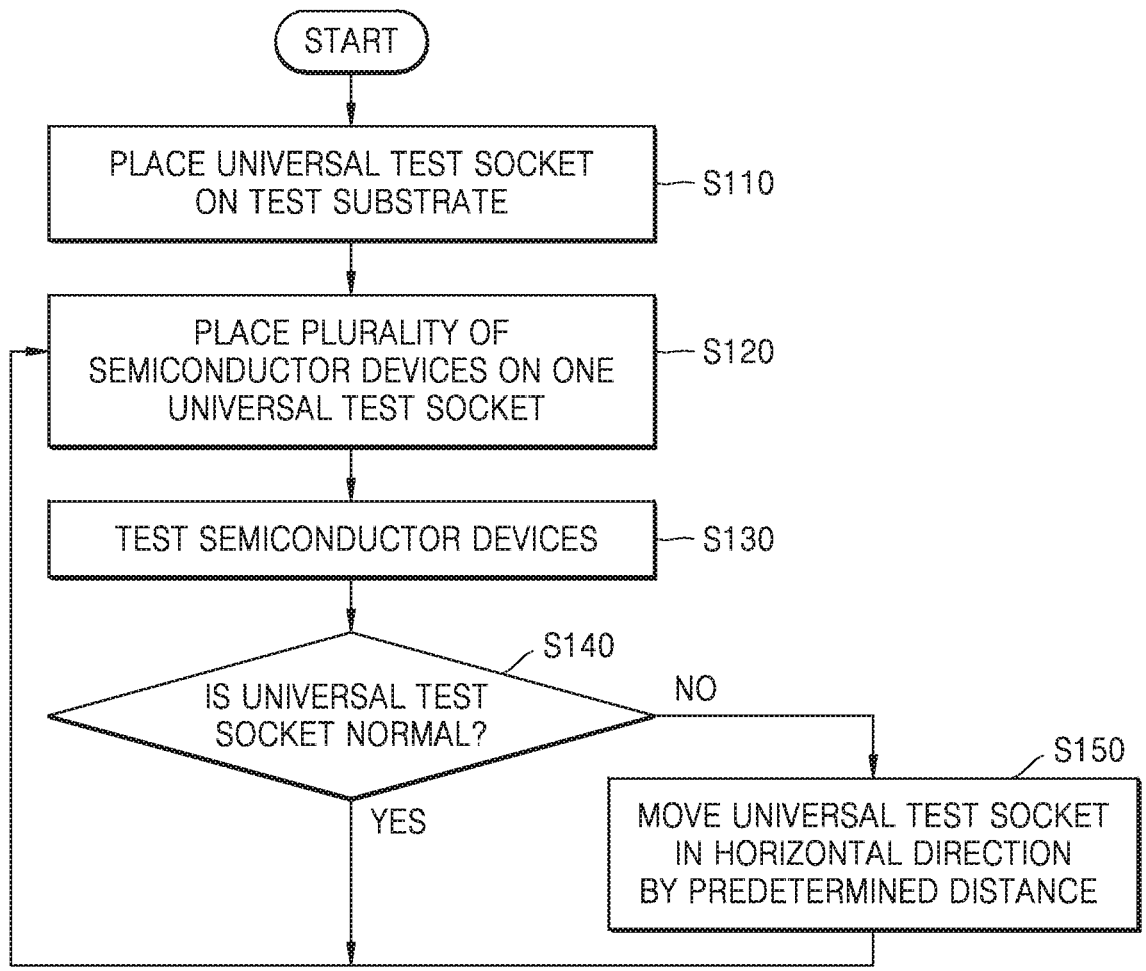
FIG. 12 is a flowchart illustrating a method of testing semiconductor devices, according to an example embodiment of the inventive concepts.

FIG. 12 is a flowchart illustrating a method of testing semiconductor devices according to an example embodiment of the inventive concepts.

Referring to FIG. 12, a universal test socket may be placed on a test substrate (S110). Because the test substrate has been described with reference to FIG. 3, a detailed description thereof will be omitted here. Because the universal test socket has been described with reference to FIG. 4, and the like, a detailed description thereof will be omitted here.

Subsequently, a plurality of semiconductor devices may be placed on one universal test socket (S120). As described above, conventional test sockets could accommodate only one semiconductor device. That is, for example, if four semiconductor devices were to be tested, four test sockets may be desired, and the four test sockets each may be desired to be mounted on the test substrate.

However, the universal test socket according to some example embodiments may accommodate a plurality of semiconductor devices in one universal test socket. This greatly reduces the time desired to mount a test socket(s) on the test substrate.

Then, a test signal is applied to the semiconductor devices to test the semiconductor devices (S130). The test signal may be designed to be unique to respective ones of the semiconductor devices.

Subsequently, it is checked whether the universal test socket is normal (S140). In FIG. 12, an operation of checking whether the universal test socket is normal may be performed after an operation of testing the semiconductor devices (S130), but the operation of checking whether the universal test socket is normal may be performed before the operation of testing the semiconductor devices (S130).

As a result, if the universal test socket is determined to be normal, test on semiconductor devices may be continuously performed.

Otherwise, if at least one of through conductors of the universal test socket is determined to be defective, the universal test socket may be moved in a horizontal direction by a desired (or alternatively, predetermined) distance to avoid the defective through conductor (S150). For example, when the test controller 1b determines that at least one through conductor of the universal test socket 20 is defective, the test controller 1b may move the universal test socket 20 in the direction parallel to the main surface of the universal test socket instead of replacing the universal test socket with another universal test socket.

Figure 13:
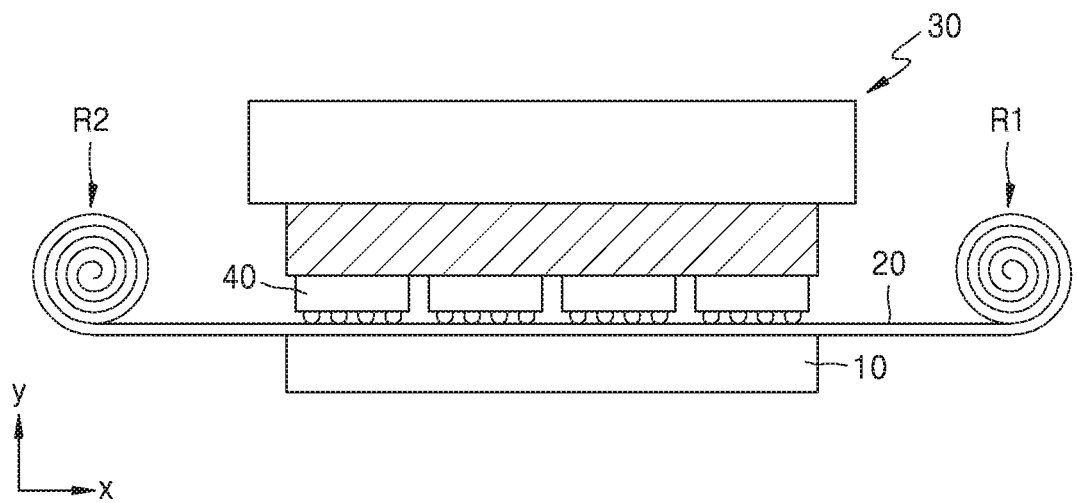
FIG. 13 is a conceptual diagram illustrating an example embodiment of a method of moving a universal test socket in a horizontal direction.

FIG. 13 is a conceptual diagram showing an example embodiment of a method of moving the universal test socket 20 in a horizontal direction.

Referring to FIG. 13, the universal test socket 20 may be disposed on the test substrate 10. For example, the universal test socket 20 may have its both ends wound around rollers R1 and R2. In this case, the universal test socket 20 may move in the horizontal direction, that is, in a direction parallel to a main surface of the universal test socket 20 by rotating the rollers R1 and R2.

In this case, a moving distance of the universal test socket 20 in the horizontal direction may be from (N+⅓) times to (N+⅔) times a terminal pitch of a semiconductor device to be tested (where N is an integer from 0 to 1,000,000). If the moving distance of the universal test socket 20 in the horizontal direction is an integral multiple of the terminal pitch of the semiconductor device to be tested, a through conductor which is determined to be defective occurs may come into contact with other terminals of the semiconductor device to be tested. Thus, it may be desired to move the universal test socket 20 slightly more (or less) than the integral multiple of the terminal pitch.

According to the example embodiments of the inventive concepts, a universal test socket may be continuously used even when a first semiconductor device to be tested is replaced with a second semiconductor device having a pitch between terminals different from that of the first semiconductor device. Further, according to the example embodiments, the universal test socket may be continuously used without replacement even when a problem occurs in one terminal. Still further, because a plurality of semiconductor devices may correspond to one universal test socket, a time to be spent on attaching and detaching a test socket on a test device may be relatively short compared with conventional test sockets.

While the inventive concept has been particularly shown and described with reference to some example embodiments thereof, it will be understood that various changes in form and details may be made therein without departing from the spirit and scope of the following claims.

What is claimed is:

1. A universal test socket comprising:
   a first sub-layer including a plurality of first through conductors, the plurality of first through conductors arranged at a first pitch in a first substrate, each of the plurality of first through conductors including a concave electrode filled with one of conductive powder or a carbon-based nanostructure; and
   a second sub-layer including a plurality of second through conductors, the second sub-layer stacked on the first sub-layer so that the plurality of first through conductors are in contact with the plurality of second through conductors, the plurality of second through conductors arranged at a second pitch in a second substrate, the second pitch being less than or equal to the first pitch.

2. The universal test socket of claim 1, wherein the second pitch is less than or equal to ½ of the first pitch.

3. The universal test socket of claim 1, wherein the first pitch is less than or equal to ½ of a pitch of terminals of a package under test.

4. The universal test socket of claim 1, wherein the concave electrode is filled with the conductive powder, and the conductive powder is micro powder, particles of which have diameters of about several micrometers or less.

5. The universal test socket of claim 1, wherein the plurality of second through conductors comprise wire pins or an array of fine conductive particles.

6. The universal test socket of claim 5, wherein the plurality of second through conductors each comprise the array of fine conductive particles and the second pitch is substantially equal to the first pitch.

7. The universal test socket of claim 5, wherein
the plurality of second through conductors comprise the wire pins; and
the wire pins are inclined.

8. The universal test socket of claim 1, further comprising:
a third sub-layer on the first substrate, the third sub-layer including a plurality of third through conductors, the plurality of third through conductors arranged at a third pitch, the third pitch being substantially same as the second pitch.

9. The universal test socket of claim 8, wherein the third sub-layer has a same structure as the second sub-layer.

10. The universal test socket of claim 1, further comprising:
a fourth sub-layer on the second substrate, the fourth sub-layer including a plurality of fourth through conductors, the plurality of fourth through conductors arranged at a fourth pitch, the fourth pitch being substantially same as the first pitch.

11. The universal test socket of claim 10, wherein the fourth sub-layer has a same structure as the first sub-layer.

12. The universal test socket of claim 1, wherein the first sub-layer and the second sub-layer are detachably attached with each other by van der Waals force.

13. The universal test socket of claim 1, wherein a portion of the plurality of first through conductors in contact with a package to be tested comprises a spherical surface or a sharp point.

14. The universal test socket of claim 1, wherein an upper portion of each of the plurality of first through conductors protrudes beyond an upper surface of the first substrate.

15. A semiconductor test device comprising:
a test main body configured to test a semiconductor device, the test main body including a universal test socket, the universal test socket including,
a first sub-layer including a plurality of first through conductors, the plurality of first through conductors arranged at a first pitch in a first substrate, each of the plurality of first through conductors including a concave electrode filled with one of conductive powder or a carbon-based nanostructure, and
a second sub-layer including a plurality of second through conductors, the second sub-layer stacked on the first sub-layer so that the plurality of first through conductors are in contact with the plurality of second through conductors, the plurality of second through conductors arranged at a second pitch in a second substrate, the first pitch and the second pitch being less than or equal to ½ of a pitch of terminals of the semiconductor device; and
a processor configured to control a test performed by the test main body.

16. The semiconductor test device of claim 15, wherein a pitch of at least one of the plurality of first through conductors and the plurality of second through conductors is less than or equal to ⅕ of the pitch of the terminals of the semiconductor device.

17. The semiconductor test device of claim 15, wherein the universal test socket is configured to move in a direction parallel to a main surface thereof.

18. The semiconductor test device of claim 17, further comprising:
rollers configured to wind both end portions of the universal test socket, respectively, and move the universal test socket by a rotation motion.

19. The semiconductor test device of claim 17, wherein the processor is further configured to control the semiconductor test device to move the universal test socket in the direction parallel to the main surface of the universal test socket instead of replacing the universal test socket with another universal test socket when the processor determines that at least one through conductor of the universal test socket is defective.

* * * * *